US008608491B2

(12) United States Patent
Hsu

(10) Patent No.: US 8,608,491 B2
(45) Date of Patent: Dec. 17, 2013

(54) ELECTRICAL CONNECTOR HAVING STRUCTURE TO PRE-SET SOLDER BALLS

(75) Inventor: Shuo-Hsiu Hsu, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 73 days.

(21) Appl. No.: 13/349,555

(22) Filed: Jan. 12, 2012

(65) Prior Publication Data

US 2012/0184151 A1 Jul. 19, 2012

(30) Foreign Application Priority Data

Jan. 18, 2011 (TW) ................................ 100201025

(51) Int. Cl.
*H01R 12/00* (2006.01)
*H05K 1/00* (2006.01)

(52) U.S. Cl.
USPC ................................................ 439/83; 439/66

(58) Field of Classification Search
USPC ...................... 439/83, 66, 342, 876, 660, 626
See application file for complete search history.

(56) References Cited

U.S. PATENT DOCUMENTS

| | | | | |
|---|---|---|---|---|
| 8,033,839 | B2 * | 10/2011 | Yeh et al. | 439/83 |
| 8,052,434 | B2 * | 11/2011 | Yeh et al. | 439/83 |
| 8,323,038 | B2 * | 12/2012 | Jin | 439/83 |
| 2008/0160801 | A1 * | 7/2008 | Gattuso et al. | 439/83 |
| 2012/0225586 | A1 * | 9/2012 | Tsai et al. | 439/626 |

FOREIGN PATENT DOCUMENTS

CN 201142504 Y 10/2008

* cited by examiner

*Primary Examiner* — Hae Moon Hyeon
(74) *Attorney, Agent, or Firm* — Wei Te Chung; Ming Chieh Chang

(57) ABSTRACT

An electrical connector includes an insulative housing with a number of passageways extending therethrough, a number of electrical contacts secured in the passageways respectively, and a number of solder balls contacting with the electrical contacts. The passageways each includes a solder ball receiving slot and a pre-setting slot below the solder ball receiving slot and expanded therefrom. The electrical contacts each have a solder tail at a lower end thereof and a contact section at an upper end thereof. The solder balls and the solder tails are disposed in the solder ball receiving slot and the pre-setting slot. The pre-setting slot restricts the solder ball at a first position and the solder ball receiving slot restricts the solder ball at a second position.

20 Claims, 5 Drawing Sheets

ELECTRICAL CONNECTOR HAVING STRUCTURE TO PRE-SET SOLDER BALLS

BACKGROUND OF THE INVENTION

1. Field of the Invention

The invention relates generally to socket connectors and particularly to a socket connector mounted to a printed circuit board.

2. Description of Related Art

Chinese patent issue No. 201142504Y issued to Lotes on Oct. 29, 2008 discloses an electrical connector mounted to a printed circuit board by solder balls. The electrical connector includes an insulative housing with a number of passageways, a number of electrical contacts received in the passageways and solder balls secured to the electrical contacts. Each passageway defines a solder ball receiving slot for accommodating a solder ball. For attaching the solder balls to the electrical contact, a fixture is set on a bottom end of the insulative housing and positions the solder balls therein and corresponding to the solder ball receiving slot, respectively whereby the solder balls on the fixture can be pressed in the solder ball receiving slot. Then the fixture is taken away.

The fixture and the solder ball receiving slots need accurate align with each other so that the solder balls can be easily and accurate attached to the corresponding slots. Therefore, it is required the fixture has a higher manufacture precision. Accordingly, the use of the fixture not only complicates the manufacture process but also increases the cost of the electrical connector.

An improved electrical connector that overcomes the above-mentioned problems is desired.

BRIEF SUMMARY OF THE INVENTION

An object of the present invention is to provide an electrical connector having structures to pre-set solder balls.

An electrical connector comprises an insulative housing, a plurality of electrical contacts and a plurality of solder balls. The insulative housing has a top surface and a bottom surface opposite to each other and defines a plurality of passageways extending therethrough. The passageways each includes a solder ball receiving slot and a pre-setting slot below the solder ball receiving slot and communicated therewith. The pre-setting slot is expanded from the solder ball receiving slot. The electrical contacts are secured in the passageways respectively and each have a solder tail at a lower end thereof and a contact section at an upper end thereof. The solder balls contact with the solder tails of the electrical contacts. The pre-setting slot restricts the solder ball at a first position and the solder ball receiving slot restricts the solder ball at a second position.

An electrical connector comprises an insulative housing, a plurality of electrical contacts and a plurality of solder balls. The insulative housing has a top surface and a bottom surface opposite to each other and defines a plurality of passageways extending therethrough. The insulative housing has a first step and a second step below the first step in the passageway. The second step enlarges the passageway at a lower end thereof. The electrical contacts are secured to the passageways respectively and each have a solder tail at a lower end thereof and a contact section at an upper end thereof. The solder balls contact with the solder tails of the electrical contacts. The solder tail and the second step position the solder ball at a first position, and the solder tail and the first step position the solder ball at a second position.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
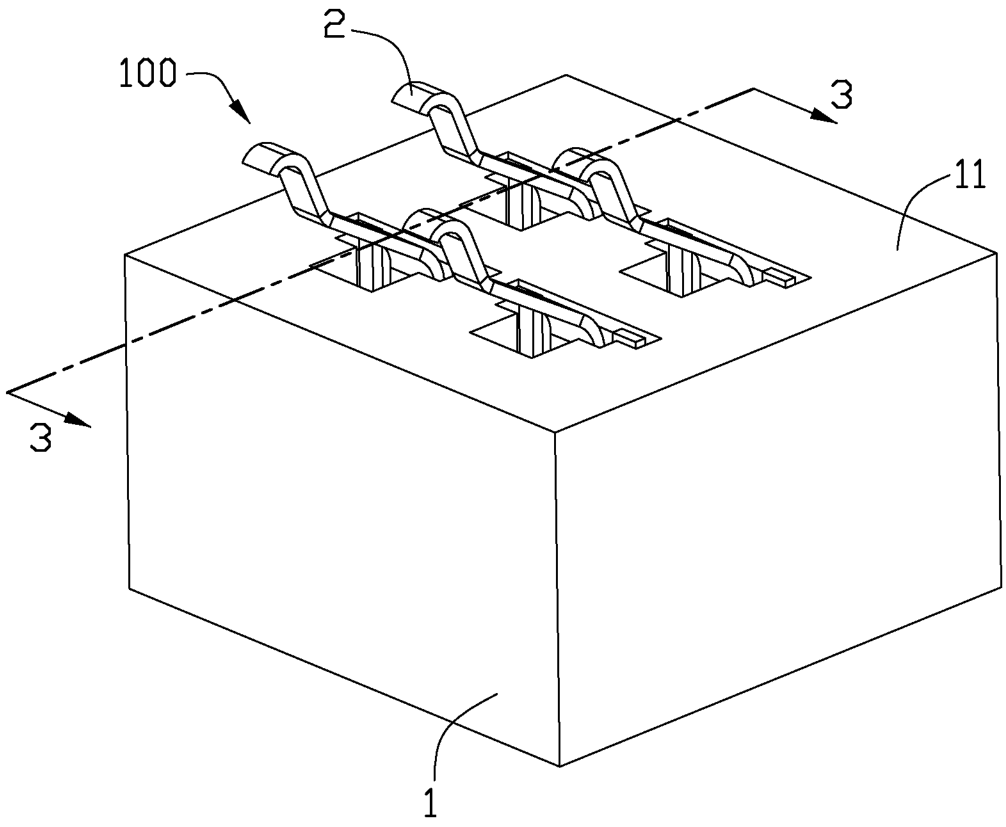
FIG. 1 is an assembled, perspective view of an electrical connector according to a preferred embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 2:
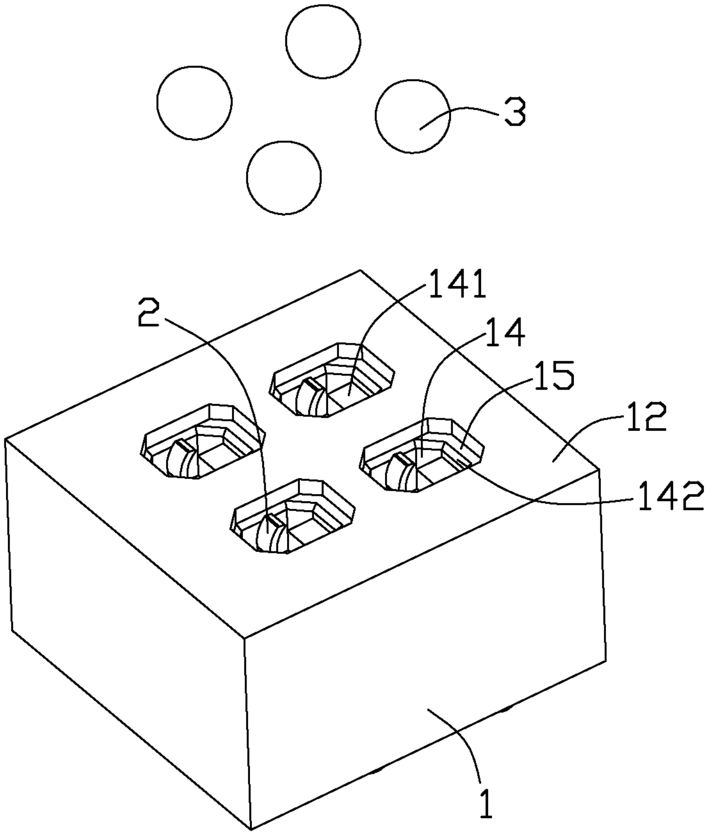
FIG. 2 is a partial exploded, perspective view of the electrical connector shown in FIG. 1.

Please referring to FIGS. 1-2, an electrical connector 100 for electrical connecting a central process unit (not shown) to a printed circuit board (not shown) comprises an insulative housing 1, a plurality of electrical contacts 2 secured to the insulative housing 1 and a plurality solder balls 3 contacting with the electrical contacts 2.

Figure 5:
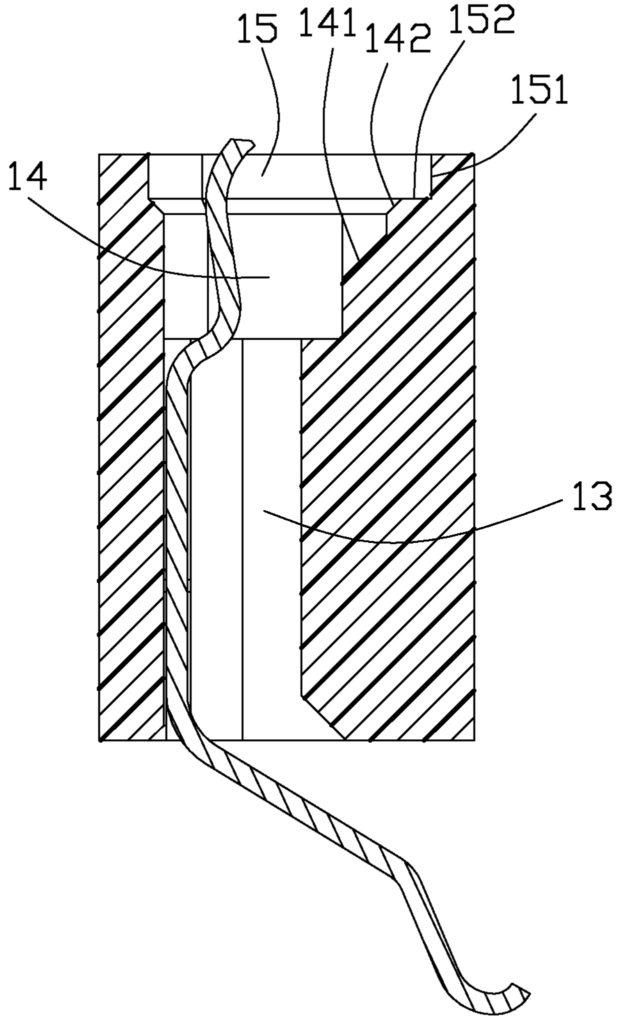
FIG. 5 is a cross-sectional view of the insulative housing.

With reference FIGS. 2 and 5, the insulative housing 1 has a top surface 11 and a bottom surface 12 opposite to each other and defines a plurality of passageways 13 extending therethrough. The passageway 13 each includes a solder ball receiving slot 14 and a pre-setting slot 15 below the solder ball receiving slot 14 and communicated therewith. The pre-setting slot 15 is expanded from the solder ball receiving slot 14 and enlarging the passageway 13 at a lower end thereof. The pre-setting slot 15 opens at the bottom surface 12 of the insulative housing 1 and has a side surface 151 and a first step surface 152. A slant second step surface 141 is disposed in the solder ball receiving slot 14. Thus, the solder ball receiving slot 14 and the pre-setting slot 15 form a first step and a second step in the passageway 13, respectively.

Figure 3:
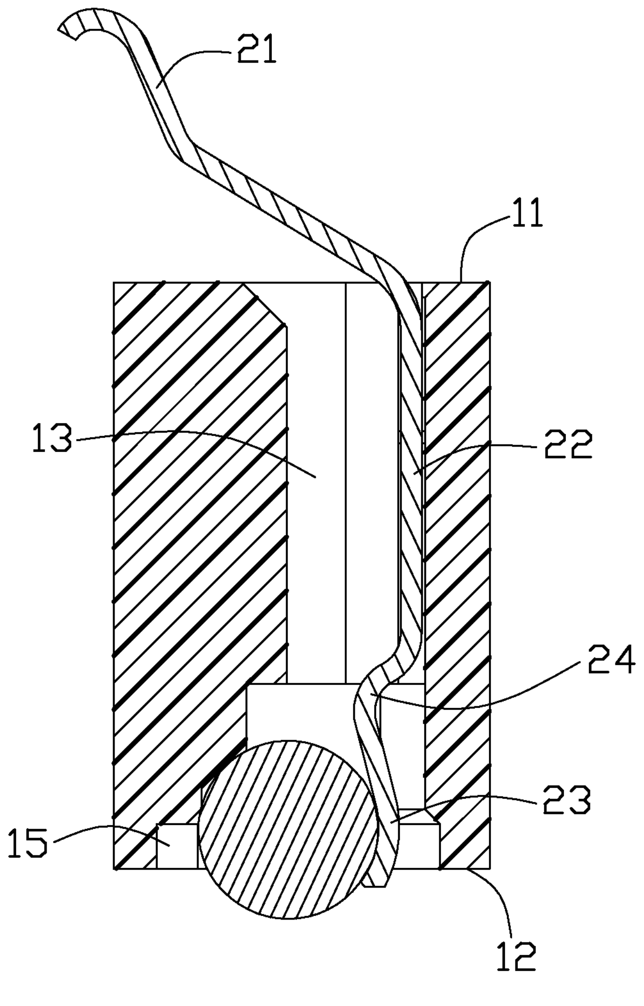
FIG. 3 is a cross-sectional view taken along line 3-3 of FIG. 1.
Figure 4:
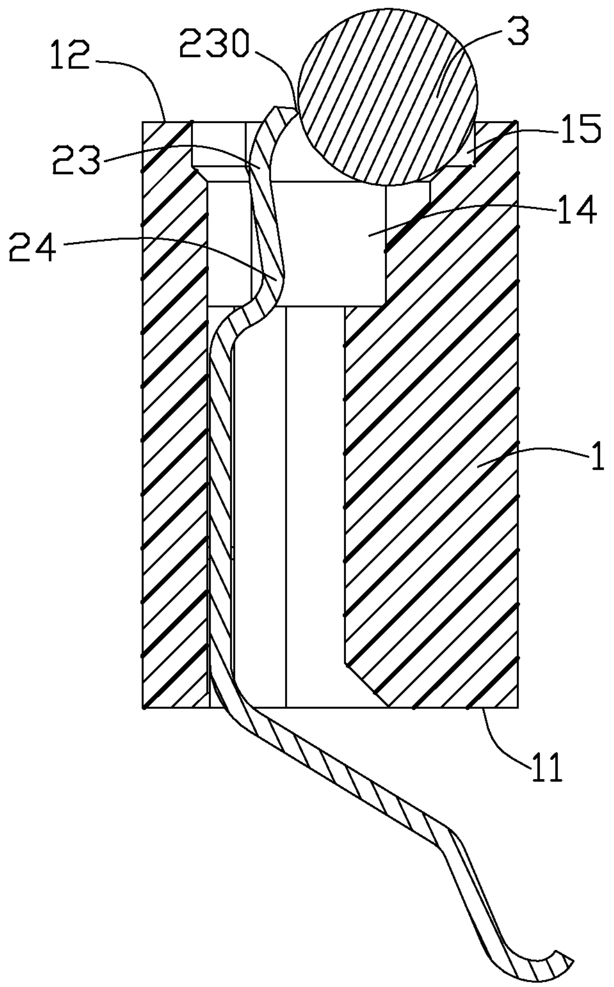
FIG. 4 is similar to FIG. 3 while the solder ball is retained on the insulative housing at an initial position.

Please referring to FIGS. 3-4, the electrical contacts 2 each has a retaining section 22 engaging with the passageway 13, a solder tail 23 at a lower end thereof and a contact section 21 at an upper end thereof. The solder tail 23 is curved and extends from one side to the other side of the passageway 13. The contact section 21 extends out of the top surface 11 of the insulative housing 1. The electrical contact 2 has a wave arrangement 24 connected with the solder tail 23 and the solder tail 23 extends downwardly and laterally from the wave arrangement 24.

The insulative housing 1 is placed upside down for assembling the solder balls 3. The solder tail 23 is located at one side of the passageway 13. The pre-setting slot 15 and the solder ball receiving slot 14 are capable of the solder tail 23 deforming therein so that the solder ball 3 moves from a first position to the second position. The solder balls 3 can be disposed and restricted in the pre-setting slot 15 firstly via contacting with the side surface 151, the first step surface 152 of the pre-setting slot 15, and a tip 230 of the solder tail 23 simultaneously at the first position as shown in FIG. 4. At this initial position, the solder balls 3 are supported by the electrical contact 2 and the first step surface 152 whereby limits a downward movement and horizontal movement of the solder balls 3 until an external force exerted thereon.

Almost a bottom half of the solder ball is exposed outside of the housing at the first stage. Then, press the solder balls 3 so that the electrical contacts 2 deform and further permit the solder balls 3 moves upwardly and laterally from the first position to the second position until the solder balls 3 contact with the solder tail 23 and the second step surface 141 at the second position so that the solder ball receiving slot 14 and the electrical contact 2 restrict the solder ball 3 at the final second position as shown in FIG. 3. An engagement force among solder ball, the housing and the terminal at the final stage is larger than that at the initial stage. A slant transition surface 142 is defined between the solder ball receiving slot 14 and the pre-setting slot 15 for guiding the movement of the solder ball 3. The solder balls 4 and the solder tails 23 are disposed in the solder ball receiving slot 14 and the pre-setting slot 15. The insulative housing 1 can instead of the fixture and position the solder balls 3 before the solder balls 3 are pressed into the insulative housing 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector comprising:

an insulative housing having a top surface and a bottom surface opposite to each other and defining a plurality of passageways extending therethrough, the passageways each includes a solder ball receiving slot and a pre-setting slot below the solder ball receiving slot and communicated therewith;

a plurality of electrical contacts secured in the passageways respectively and each having a solder tail at a lower end thereof and a contact section at an upper end thereof; and a plurality of solder balls contacting with the solder tails of the electrical contacts; wherein the pre-setting slot is expanded from the solder ball receiving slot, and the pre-setting slot restricts the solder ball at a first position and the solder ball receiving slot restricts the solder ball at a second position.

2. The electrical connector as claimed in claim 1, wherein the solder balls moves upwardly and laterally from the first position to the second position after being pressed.

3. The electrical connector as claimed in claim 1, wherein the pre-setting slot opens at the bottom surface of the insulative housing and has a side surface and a first step surface.

4. The electrical connector as claimed in claim 3, wherein the solder ball contacts with the side surface, the first step surface of the pre-setting slot, and a tip of the solder tail at the first position.

5. The electrical connector as claimed in claim 1, wherein a step is disposed in the solder ball receiving slot, and wherein the solder ball contacts with the solder tail and the step at the second position.

6. The electrical connector as claimed in claim 1, wherein the electrical contact has a wave arrangement connected with the solder tail and the solder tail extends downwardly and laterally from the wave arrangement.

7. The electrical connector as claimed in claim 1, wherein the solder tail is located at one side of the passageway, and the pre-setting slot and the solder ball receiving slot are capable of the solder tail deforming therein when the solder ball moves from the first position to the second position.

8. The electrical connector as claimed in claim 1, wherein the solder tail is curved and extends from one side to the other side of the passageway, and the contact section extends out of the top surface of the insulative housing.

9. An electrical connector comprising:

an insulative housing having a top surface and a bottom surface opposite to each other and defining a plurality of passageways extending therethrough, the insulative housing having a first step and a second step below the first step in the passageway, the second step enlarging the passageway at a lower end thereof;

a plurality of electrical contacts secured to the passageways respectively and each having a solder tail at a lower end thereof and a contact section at an upper end thereof; and a plurality of solder balls contacting with the solder tails of the electrical contacts; wherein the solder tail and the second step support the solder ball at a first position, and the solder tail and the first step position the solder ball at a second position.

10. The electrical connector as claimed in claim 9, wherein the solder balls moves upwardly and laterally from the first position to the second position after being pressed.

11. The electrical connector as claimed in claim 9, wherein the solder ball contacts with a side surface of the passageway at the first position.

12. The electrical connector as claimed in claim 9, wherein the first step has a slant surface contacting with the solder ball at the second position.

13. The electrical connector as claimed in claim 9, wherein the electrical contact has an upper wave arrangement connected with the solder tail and the solder tail extends downwardly and laterally from the wave arrangement.

14. The electrical connector as claimed in claim 9, wherein the solder tail is located at one side of the passageway, and the lower end of the passageway is capable of the solder tail deforming therein when the solder ball moves from the first position to the second position.

15. The electrical connector as claimed in claim 9, wherein the solder tail is curved and extends from one side of the passageway to the other side, and the contact section extends out of the top surface of the insulative housing.

16. An electrical connector comprising:

an insulative housing with a plurality of passageways extending therethrough in a vertical direction between two opposite upper and bottom surfaces;

a plurality of terminals into the corresponding passageways, respectively, each of said terminal including an upper mating section extending upwardly above the upper surface, and a lower mounting section around the bottom surface; and a plurality of solder balls upwardly inserted into the corresponding passageways, respectively; wherein a bottom portion of each passageway and the lower mounting section of each corresponding terminal are configured to commonly define therebetween, in a transverse direction perpendicular to said vertical direction, a receiving cavity under condition that said receiving cavity defines opposite upper and lower receiving spaces in the vertical direction so as to allow the corresponding solder ball to be temporarily held in a lower receiving space at an initial stage during insertion of the solder ball into the corresponding passageway for easing pre-assembling of the solder ball with regard to the housing and the corresponding terminal, and to be permanently held in the upper receiving space at a final stage for assuring engagement among the solder ball, the housing and the terminal.

17. The electrical connector as claimed in claim 16, wherein an engagement force among solder ball, the housing and the terminal at the final stage is larger than that at the initial stage.

18. The electrical connector as claimed in claim 16, where almost a bottom half of the solder ball is exposed outside of the housing at the first stage.

19. The electrical connector as claimed in claim 16, wherein the terminal defines a curved configuration on the bottom section to contact and hold the corresponding solder ball in position at the final stage while with a tip of said curved configuration to contact and retain the corresponding solder ball at the initial stage.

20. The electrical connector as claimed in claim 16, wherein the bottom portion of each passageway includes a lower larger opening to define said initial stage, and an upper smaller opening to define said final stage under condition that the solder ball is moved toward the terminal when said solder ball is moved from the initial stage to the final stage.

* * * * *